United States Patent [19]

Schmidt

[11] Patent Number: 4,952,557

[45] Date of Patent: Aug. 28, 1990

[54] FORMATION OF SUPERCONDUCTING ARTICLES BY ELECTRODEPOSITION

[75] Inventor: Ferenc Schmidt, Brynmawr, Pa.

[73] Assignee: Ametek, Inc., New York, N.Y.

[21] Appl. No.: 215,581

[22] Filed: Jul. 6, 1988

Related U.S. Application Data

[63] Continuation-in-part of Ser. No. 118,657, Nov. 9, 1987, abandoned.

[51] Int. Cl.$^5$ ............................................. C25B 7/00
[52] U.S. Cl. .................................... 505/1; 204/180.1; 204/182.1; 204/180.9; 505/739; 505/737
[58] Field of Search ............................ 505/816, 817, 1; 204/180.1

[56] References Cited

U.S. PATENT DOCUMENTS

| | | | |
|---|---|---|---|
| Re. 32,178 | 6/1986 | Yoshizaki | 29/599 |
| 4,108,737 | 8/1978 | Ehrhardt | 204/13 |
| 4,810,339 | 3/1989 | Heavens | 204/180.1 |

OTHER PUBLICATIONS

Chu, C. W. et al., "Evidence for Superconductivity Above 40K in the La—Ba—Cu—O Compound System," Physical Review Letters, vol. 58, No. 4, (Jan. 26, 1987), pp. 405–407.

Wu, M. K. et al., "Superconductivity at 93K in a New Mixed-Phase Y—Ba—Cu—O Compounds System at Ambient Pressure," Physical Review Letters, vol. 58, No. 9, (Mar. 2, 1987), pp. 908–910.

Sun, J. Z. et al., "Superconductivity and Magnetism in the High-$T_c$ Superconductor Y—Ba—Cu—O," Physical Review Letters, vol. 58, No. 15, (Apr. 13, 1987), pp. 1574–1576.

Cava, R. J. et al., "Bulk Superconductivity at 91K in Single-Phase Oxygen-Deficient Perovskite $Ba_2YCu_3O_9$—," Physical Review Letters, vol. 58, No. 16, (Apr. 20, 1987), pp. 1676–1679.

Murphy, D. W. et al., "New Superconducting Cuprate Perovskites," Physical Review Letters, vol. 58, No. 18, (May 4, 1987), pp. 1888–90.

Wang, H. H. et al., "Comparison of Carbonate, Citrate, and Oxalate Chemical Routes to the High-$T_c$ Metal Oxide Superconductors $La_{2-x}Sr_xCuO_4$," Inorganics Chemistry, vol. 26, No. 10, (May 20, 1987), pp. 1474–1476.

Ovshinsky, S. R. et al., "Superconductivity at 155K," Physical Review Letters, vol. 58, No. 24, (Jun. 15, 1987), pp. 2579–2581.

Davison, S. et al., "Chemical Problems Associated with the Preparation and Characterization of Superconducting Oxides Containing Copper," in: Nelson, D. L. et al., Chemistry of High-Temperature Superconductors (Wash., D.C., American Chemical Society, 1987), pp. 65, 70 and 71.

Poeppel, R. B. et al., "Fabrication of $YBa_2Cu_3O_7$ Superconducting Ceramics," in: Nelson, D. L. et al., Chemistry of High-Temperautre Superconductors, (Wash. D.C., American Chemical Society, 1987), pp. 261–265.

The Application of Superconducting Ceramics as Substrates for the Electrochemical Deposition of Conducting Polymers and Metals by Kaneto et al., Japanese Journal of Applied Physics, vol. 26, No. 11, (1987).

Superconductivity and Magnetism in the High-Tc Superconductor Y—Ba—Cu—O by Sun et al., Physical Review Letters, vol. 58, No. 15, (1987).

Comparison of Carbonate, Citrate, and Oxalate Chemical Routes to the High Tc Metal Oxide Superconductors $La_{2-x}Sr_xCUO_4$ by Wang et al., Inorganic Chemistry, vol. 26, (1987).

Preparation of $(La_{1-x}Sr_x)_2CUO_4$ Superconducting Films by Screen Printing Method by Koinuma et al., Japanese Journal of Applied Physics, Line 26, No. 4, (1987).

High $T_c$ Superconductivity in Screen Printed Yb—Ba—Cu—O Films by Koinuma et al., Japanese Journal of Applied Physics, vol. 26, No. 5, (1987).

Primary Examiner—John F. Niebling
Assistant Examiner—Isabelle Rodriguez
Attorney, Agent, or Firm—Amster, Rothstein & Ebenstein

[57] ABSTRACT

A method for depositing superconducting ceramic materials on an article by electrodeposition including the steps of obtaining a dispersion of the components of a superconducting ceramic material in a non-aqueous medium and creating an electrical field within the medium such that the material will migrate to and deposit on an electrode placed within the medium. After deposition, the article is sintered and then reoxygenated to achieve the composition required for the superconducting ceramic material.

40 Claims, No Drawings

FORMATION OF SUPERCONDUCTING ARTICLES BY ELECTRODEPOSITION

This application is a continuation-in-part of application Ser. No. 118,657, filed Nov. 9, 1987, abandoned 05/03/89.

The invention relates to the formation of useful superconducting articles of various shapes and sizes by utilizing electrodeposition techniques.

A new class of superconductors, comprising certain metal-oxide ceramics, can conduct electricity with virtually no resistance at temperatures above the boiling point of liquid nitrogen (77° K. or −196° C.). One such superconductor is the yttrium-barium-copper oxide with the approximate composition of $Y_{1.2}Ba_{0.8}CuO_4$. Another better known composition is $Y_1Ba_2Cu_3O_{7-x}$. The metal-oxide ceramic superconductors, of which the Y—Ba—Cu—O composition is representative, have been the subject of intense experimentation regarding appropriate substitutions for yttrium, barium and copper in order to determine the effect of such substitutions on the transition temperature (i.e., the temperature at which the material becomes superconductive). For example, yttrium can be replaced by most other rare-earth elements, barium can be replaced by other alkaline-earth elements and oxygen can be replaced at least partially by fluorine. More recently, oxide superconductors comprising oxides of strontium, calcium, bismuth, and thallium in various combinations along with copper have been discovered which have transition temperatures above 100°K. At present, a successful substitute for copper has not yet been found, although at least the following elements have been unsuccessfully substituted Ag, Au, Fe, Ni and Co.

Most common processing techniques include solid-state reactions and solution co-precipitation to form bulk Y—Ba—Cu—O, or other oxide-based superconducting materials. Vapor deposition, sputtering, plasma spray, and molecular-beam epitaxy are among those techniques suitable for producing thin films. The sol-gel method has also attracted attention for synthesizing extremely homogenous and fine particles. Superconductors revert to their normal non superconducting state when the current density through the material exceeds a critical value. Superconductors exhibiting very high critical current densities, as required in large scale applications, are currently being sought. Difficulties in achieving high critical current densities are partly due to the intrinsically large anisotropy and complex grain boundaries of the orthorhombic ceramic materials. As a result, efforts are being placed on developing techniques suitable for enhancement of grain alignment as well as for conditioning their boundaries.

A typical recipe for creating the Y—Ba—Cu—O superconducting material calls for heating an intimate mixture of the oxide or carbonate powders of the elements at temperatures between 800° C. and 1100° C. If carbonate powders are used, the heating drives off carbon dioxide from the carbonates and converts them to the desired compound of Y, Ba, and Cu oxide. After regrinding and reheating, the mixture is typically pressed into pellets and sintered (bonded without melting) at temperatures similar to those noted above for several hours in order to form the composite oxide. The pellets may then be re-oxygenated at a lower temperature, typically 400° to 550° C., to replace some of the oxygen which may have been lost during the high temperature sintering step.

Generally, pellet or coupon shapes are easy to fabricate from the superconducting materials but are not particularly useful. Tubular or wire shapes would be the most desirable. However, the brittle and fragile coupons cannot be drawn out to form wires as copper and other ductile metals can. In one process for fabricating a useful wire shape, the ceramic superconducting powder was mixed with an organic binder and the mixture was extruded or the powder was used to fill a metal tube, which was then drawn through a die to reduce its diameter. In other attempts the binder superconductor powder mixture was bonded to a substrate, such as a non super-conducting wire made out of copper.

In order to find an effective method for forming useful articles out of superconducting ceramic material, the following fabrication processes have also been used or proposed: evaporation, sputtering, rapid solidification on substrates, calcining-grinding-sintering to final shape or to an intermediate shape followed by machining, high pressure oxygen sintering, isostatic pressing, co-precipitation sintering, extrusion, and explosive compacting. Unfortunately, the techniques described above are extremely limited in effectiveness and as to the type of superconducting article which can be produced. As a result, one of the major problems facing the superconductor industry is the development of suitable fabrication techniques which will enable the formation of the superconducting ceramic material into useable shapes and articles.

Accordingly, it is an object of the present invention to provide a fabrication technique which enables the formation of superconducting ceramic material into useable shapes and articles.

Additionally, it is an object of the present invention to provide a fabrication technique which enables formation of superconducting ceramic materials having improved critical current densities.

Another object of the present invention is the use of electrodeposition techniques to fabricate superconducting ceramic material into useable shapes and articles.

Still another object of the present invention is the use of electrophoresis and dielectrophoresis to fabricate superconducting ceramic material into useable shapes and articles.

A further object of the present invention is the use of electrodeposition techniques to fabricate superconducting ceramic material into complex shaped articles.

A still further object of the present invention is the use of electrodeposition techniques to coat articles with superconducting ceramic material.

An additional object of the present invention is the use of electrodeposition techniques to achieve a coating of superconducting ceramic material of uniform thickness on an article.

The invention is the use of electrodeposition techniques (especially electrophoresis and dielectrophoresis) for fabricating useful articles out of superconducting ceramic material. As used herein, the term "superconducting ceramic materials" includes the Y—Ba—Cu—O superconductor as well as superconductors utilizing additional components or substitute components (including substitutes for copper) as well as superconductors of other formulations which may be developed in the future. One or more elements in the Y—Ba—Cu—O base compound may be substituted with other elements, typically, other rare earth elements for Y, other alkaline earth elements for Ba, other metallic elements for Cu, and F or other halogens for O. Compounds containing bismuth and thallium have also proven to be high temperature (>100° K.) superconductors. The purpose of these substitutions may be to raise the transition temperature of the material or to improve the mechanical behavior and thermal and environmental stability of the resulting superconductors.

Electrophoresis involves the suspension in a liquid medium of certain finely divided materials which then acquire an electrical charge. The polarity of this charge depends upon the nature of the material and the dispersion medium. For example, carbon, metals, sulphur and cellulose in high purity water are found to have a negative charge, due to the adsorption of hydroxyl ions; however, metal oxides and hydroxides possess a positive charge, due to the adsorption of hydrogen ions. The fact that these suspensoid particles have a charge means that they will move under the influence of a d-c electrical field.

This basic motion makes it possible to deposit various types of coatings. The list of substances which can be deposited this way includes rubber, latex, oxides, metals, lubricants, cellulose, graphite, natural and synthetic resins, and now, superconducting ceramic materials.

It is necessary to use a non-aqueous liquid medium in electrophoretic techniques for superconducting ceramic materials since the rare-earth (yttrium) and alkaline earth (barium) metal oxides react with water. This reaction is deleterious to the formation of the desired superconducting ceramic material. As in all electrophoretic processes, the medium should be electrically non-conducting, or at most very poorly conducting.

The superconducting ceramic material is not dissolved in the medium, but merely suspended. Acceptable media include, for example, acetone, toluene and methyl-ethyl ketone. Two electrodes are placed in the bath. The electrodes represent an anode and a cathode and may be formed of conventional electrode materials, such as steel, copper, carbon, aluminum, etc.

A potential of several hundred volts is applied across the electrodes and this produces a migration of the material to either the anode or the cathode depending upon the electric charge the material carries. The material is deposited on the appropriate electrode where its charge is neutralized. The electrode may be fashioned into the desired final shape for the coating. A great advantage of this technique is the fact that even if the electrode is an irregular shape, a uniform coating of the material will result because of the additional resistance due to the build up of coating. As such, this technique is ideal for creating superconducting articles having complex shapes.

Once a quantity of the powder is deposited (which could take minutes to hours), the coated electrode is removed from the bath and may be processed further to achieve a desired shape. It can then be sintered to bond the deposited particles to one another and thus yield a stronger article. The sintering can be done at 800° C. to 1100° C. However, after sintering at these temperatures it may be necessary to re-oxygenate the ceramic material to compensate for any oxygen loss which has occurred at high temperature.

A variation of this process which is included in this invention is the use of dielectrophoretic deposition. In this technique (which is similar to electrophoresis) the intensity of the electric field is non uniform and the particles migrate towards the area of increasing field intensity independent of preexisting charge. In an example of a dielectrophoretic geometry for a deposition bath, a central wire and a concentric cylinder are the two electrodes and the particles migrate onto the wire (e.g. the center of the bath). This technique is extremely well suited for cladding wire with superconducting material.

One embodiment of the invention includes the initial step of preparing a colloidal dispersion of yttrium, barium and copper carbonates, or substitutions of any or all of these elements, in a non-conducting, polar organic medium.

In fact, any salt or other compound of the desired elements which will decompose upon heating to form oxide compounds may be used for the starting components of the dispersion. As used herein, the term "colloidal" means that the particles in the dispersion are of a size less than a micron in diameter, so that they do not settle out of the medium easily. It may be advantageous to vary the particle size of the yttrium, barium and copper carbonates to control the deposition characteristics.

In another embodiment of the invention, a powder of the desired ceramic oxide material may be suspended in the medium. Preparation of the ceramic material for dispersion in the medium usually consists of grinding in a colloid mill or mortar followed by ultrasonic vibration or any other method which will result in a suspension of the ceramic material in the medium. A small amount of surfactant may be added to increase the electric charge on the particles.

An alternate process for the preparation of the suspension is the preparation of an aqueous solution of yttrium, barium and copper nitrates, followed by addition of oxalic acid and ammonia in order to coprecipitate Y, Ba and Cu oxalates. This process must be carried out at a carefully controlled pH, so as to preclude premature precipitation of hydroxides, but permits simultaneous precipitation of oxalates. This results in finer intermixing than attainable with colloid milling. Of course, the anion does not need to be oxalate; carbonates and hydroxides, or other decomposable salts could also be used. However, the dissociation constants of the respective oxalates are extremely small, $K_p = 8 \times 10^{-23}$, $1.6 \times 10^{-7}$ and $2.3 \times 10^{-8}$, respectively. The precipitates are filtered on a Gooch filter, washed, dried and can be ultrasonically dispersed as above.

As noted above, the dispersion medium may be acetone, toluene, methyl-ethyl ketone, isobutyl alcohol, propylene carbonate, amyl acetate, butyl acetate, etc., or mixtures thereof, or other media which are commonly used in electrophoresis. Organic media are sensitive to moisture and may require use of controlled atmosphere conditions.

Electrophoretic deposition of the material is then accomplished using a typical voltage in the order of 5–100 volts per cm of electrode separation. The deposition rate is a function of the concentration of charged particles and electric field intensity, and ranges from several minutes to hours per mil thickness of deposit. As such, this can be considered to be a fast deposition process. High field intensities permit better axial alignment of the particles. Therefore, low concentrations of charged particles are typically used to permit application of higher voltages while still maintaining control over the deposition rate. The electrodes can be formed from any conductive material, e.g. metal or alloy, and in any desired configuration, e.g. strips, wires, etc.

After deposition the material is sintered by, for example, radio frequency induction heating. Use of radio frequency induction heating can take the place of the otherwise lengthy heat soaking process which typically requires 10 to 16 hrs at 800–1000° C. This is a fast process with rapid heating. Because of the rapid heating, diffusion of the electrode material into the ceramic layer, and the consequent contamination of the superconductor by the diffused atoms is sharply reduced or eliminated.

Finally, oxygen annealing at lower temperatures is performed to re-establish the correct oxygen ratio. This step is similar to other powder metallurgical superconductor fabrication processes.

Under certain conditions, co-precipitation of materials from solution yields a reacted compound material. No additional heat treatment is required to cause the reaction. For example, we have co precipitated the oxalates of Y, Ba, Cu, from a solution of their soluble salts (e.g., nitrates). X-ray diffraction patterns of the co precipitated material, do not show lines corresponding to the individual oxalates, but rather show lines which are very similar to the 1-2-3 oxalate compound of Y, Ba, Cu. Thus, a reaction occurs between the individual oxalate materials to form the compound oxalate, without the requirement of any additional heat treatment. This technique may permit elimination of the high temperature heating step, which, in order to obtain sufficient interdiffusion of atoms to promote the necessary reactions, is required by all other known methods of forming the superconducting material.

EXAMPLE 1

Separately, one gram each of yttrium, barium and copper carbonates wetted with methyl-ethyl ketone (MEK) were ground by hand (instead of a colloid mill) for thirty minutes in glass mortars. The resulting pastes were ultrasonically dispersed into 200 ml MEK in a glass beaker. One cm wide aluminum strip electrodes were placed in the glass beaker 2.5"apart.

The voltage was slowly raised to 500 V without any appreciable deposition. The experiment was repeated with the addition of 0.2 ml of ZONYL FCA (a trade name of Dupont for a fluorosurfactant) to the medium. The recommended range for the surfactant is 0.005 to 0.1% per volume of medium. Other surfactants may also be used, such as TRITON (Rohm & Haas Co.) and TERGITOL (Union Carbide). Preferably, the surfactant is added during grinding. However, in this example it was added to the existing bath. With the use of a surfactant, deposition on the anode started immediately once the voltage reached the range of 15–30 V (the lower range of deposition voltage is for yttrium carbonate, the higher deposition voltage for the barium carbonate). The deposit was very uniform, well adherent and ready for sintering. The deposit had the typical "green strength" characteristics familiar in powder metallurgy.

The amount deposited was a linear function of the voltage and ranged from 1.4 mg/cm$^2$ at 50 V for the Ba carbonate to 4.3 mg/cm$^2$ for the Y carbonate, with copper being in between.

The following is the basic linear equation for electrophoresis:

$W = XpetS (C/6)(3.14)v$ where W = weight of deposit
X is the potential gradient
p is electrokinetic potential
e is the dielectric constant of the medium
t is time
S is electrode surface area
C the concentration of particles
v is the viscosity of the medium.

This equation teaches how to control the deposition rates of the individual components in order to achieve a desired deposited composition. A simple approach is to have lower concentration of the faster depositing carbonate and vice versa. Fine tuning can be achieved by changing other parameters, such as particle size (for changing p), use of other media (for changing e), etc.

The three pastes were mixed and a uniform, homogenous 3 mil thick Y—Ba—Cu carbonate deposit was obtained at 30 volts in 5 minutes. Subsequently, it was found that higher voltages (several hundred and up) permitted better crystallographic alignment of the deposit.

In further experiments conducted in accordance with this invention a $Y_1Ba_2Cu_3O_{7-x}$ powder was electrophoretically deposited onto both copper and silver coils.

Electrophoretic deposition is a lower cost, simpler and faster superconductor fabrication technique than any other currently known technique. It appears to have the following very important advantages: eliminates the need for the isostatic pressing necessary in powder metallurgy (because the deposit is dense and compact), eliminates the very long high temperature heating needed to provide interdiffusion (because the particles are so intimately mixed and the crystallites are very uniform) and, for the same reason, eliminates contamination resulting from substrate diffusion into the superconductor. In addition, the film thickness can be varied by voltage adjustment and uniform results are obtained on complex shapes.

Further, electrophoretic deposition, can achieve enhancement of grain alignment and grain boundary conditioning. Several controllable variables are present in this process: concentrations of individual ingredients, dielectric constant and viscosity of the medium, applied voltages, and types of surfactants. The last three factors contribute to the preferential orientation during deposition, while all the four factors can be selected to tailor other aspects of the products' microstructures. Electron microscope examination of superconductors formed by electrophoretic deposition in accordance with this invention reveal some alignment of the individual particles. Present superconductors conduct typically only up to 5000 amps/cm$^2$ since generally only about 1% of their particles are aligned (i.e., continuous filaments are approximately one percent of volume). Each additional percentage of increase in alignment is therefore highly significant.

In order to achieve this preferential alignment of the individual particles, it is desirable to start with a finely ground powder of the material, having overall dimensions ≦10 microns, and further having particles which are elongated or needle shaped with at least a 2 to 1 aspect ratio. The higher the aspect ratio, the better the alignment will be as a result of the electrophoresis or dielectrophoresis process. Although the tetragonal and orthorhombic 1-2-3 crystals are by nature somewhat elongated, their natural aspect ratios are not sufficient to provide good alignment. However, there are techniques available for growing needle shaped particles of these materials. When such needle shaped particles are subjected to the electrophoresis or dielectrophoresis process, the resulting deposited material exhibits the preferentially oriented structures, which can be associated with higher critical current densities.

As noted above, this invention allows the production of superconductors having various geometries. This can be achieved by pre-forming the electrode over which the deposition occurs into the specific shape required for a given application. This advantage is significant, considering the brittleness of the oxide ceramics, which makes most of the conventional metal-forming techniques unpractical.

The starting materials of electrophoretic deposition can be either finely-ground superconducting compound particles, such as Y—Ba—Cu—O (or variations thereof) or individual starting ingredients for the compounds such as Y-oxide, Ba-oxide, and Cu-oxide, or other compounds which react to form oxides upon heating. The latter case combines synthesis with processing and has advantages similar to those of the sol-gel approach. The resulting fine-particle products can then be sintered at relatively low temperatures due to the short diffusion distances.

For large scale applications of superconductors such as generators, motors, and electromagnets, the superconductor materials must be in wire form, which can then be processed into windings. As noted above, the dielectrophoretic deposition process of this invention is ideal for forming wires. In contrast to the electrophoretic process which works on the principle of having dispersed particles moving across a relatively uniform potential difference between two electrode plates, the dielectrophoretic process is based on the presence of large electric field gradients around the electrodes. Highly polarizable molecules or particles can be aligned into shapes dictated by the electrode design. Large electric field gradients can be induced around a small radius wire electrode. Therefore, one can conveniently produce a superconducting wire by using a fine wire electrode with the superconducting materials formed over it by the dielectrophoretic process.

This technique is also attractive for coil formation, particularly if only one layer is required for the coil. In this situation, the electrode is simply a coil of the required geometry. Alternatively, an insulating tube of the same radius as required for the coil may be coated with a conducting layer, and then etched into a spiral conducting path with the required pitch. The dielectrophoretic process can then proceed with the spiral conducting path as the electrode. If necessary, the electrode and mandrel upon which it is formed, can always be removed afterwards by various techniques, e.g. heating if the electrode and/or mandrel are made of low melting point materials, or by dissolving the electrode and/or mandrel in suitable solvents, or by collapsing the structure if the electrode and/or mandrel are of a collapsible design.

Although the invention herein has been described with reference to particular embodiments, it is to be understood that these embodiments are merely illustrative aspects of the invention. Thus, it is to be understood that numerous modifications may be made in the illustrative embodiments and other arrangements may be devised without departing from the spirit and scope of the invention.

What is claimed is:

1. A method for forming an oxide superconducting material on an article comprising the steps of:
   (a) preparing a mixture of coponents needed to synthesize the oxide superconducting material;
   (b) preparing a colloidal dispersion of the mixture in a substantially non-conducting liquid medium;
   (c) placing two electrodes in the liquid medium wherein one of the electrodes comprises the article upon which deposition is desired;
   (d) applying a difference in electrical potential between the two electrodes such that the mixture of components in the medium forms a deposit on the electrode which comprises the article; and
   (e) heating the deposit in an oxygen-containing atmosphere to form the oxide superconducting material.

2. The method of claim 1 in which step (e) comprises sintering the deposit at a temperature high enough to form an oxide material and densify the oxide material.

3. The method of claim 2 which further comprises the additional step (f) of heating the deposit in an oxygen atmosphere.

4. The method of claim 1, 2, or 3 which further comprises the additional step of shaping the article into a desired form after step (d).

5. The method of claim 1, 2, or 3 in which the components are selected from the group consisting of compounds which form oxides upon heating.

6. The method of claim 1, 2, or 3 in which the components are selected form the group consisting of compounds of the rare-earth, alkaline-earth, copper, strontium, calcium, bismuth, thallium, and oxygen.

7. The method of claim 1 2, or 3 in which the components are selected from the group consisting of carbonates, oxalates, oxides, and nitrates.

8. The method of claim 1 2, or 3 in which the liquid medium is an organic solvent.

9. The method of claim 1 2, or 3 in which the liquid medium is selected from the group consisting of acetone, toluene, methyl-ethyl ketone, isobutyl alcohol, propylene carbonate, amyl acetate and butyl acetate.

10. The method of claim 1 2, or 3 which further comprises adding a surfactant to the mixture of components.

11. The method of claim 1 2, or 3 which further comprises adding a surfactant to the liquid medium.

12. The method of claim 1 2, or 3 wherein the two electrodes are geometrically shaped and positioned so that the application of a difference in electrical potential between the two electrodes produces a gradient of electric field in the liquid medium.

13. A method for forming an oxide superconducting material on an article comprising the steps of:
   (a) preparing a colloidal dispersion of particles needed to synthesize a superconducting oxide material in a substantially non-conducting liquid medium, said particles being selected to have an aspect ratio of at least two to one;
   (b) placing two electrodes in the liquid medium wherein one of the electrodes comprises the article upon which deposition is desired;
   (c) applying a difference in electrical potential between the two electrodes such that the material in the medium forms a deposit on the electrode which comprises the article; and
   (d) sintering the deposit to densify the material.

14. The method of claim 13 which further comprises the additional step (e) of heating the deposit in an oxygen atmosphere.

15. The method of claim 13 which further comprises the additional step (e) of heating the deposit in an oxygen atmosphere.

16. The method of claim 13, 14 or 15 which further comprises the additional step of shaping the article into a desired form after step (c).

17. The method of claim 13, 14 or 15 in which the compound includes elements selected from the group consisting of rare-earths, alkaline-earths, copper, bismuth, thallium and oxygen.

18. The method of claim 13, 14 or 15 in which the liquid medium is an organic solvent.

19. The method of claim 13, 14 or 15 in which the liquid medium is selected from the group consisting of acetone, toluene, methyl-ethyl ketone, isobutyl alcohol, propylene carbonate, amyl acetate and butyl acetate.

20. The method of claim 13, 14 or 15 which further comprises adding a surfactant to the compound.

21. The method of claim 13, 14 or 15 which further comprises adding a surfactant to the liquid medium.

22. The method of claim 13, 14 or 15 wherein the two electrodes are geometrically shaped and positioned so that the application of a difference in electrical potential between the two electrodes produces a gradient of electric field in the liquid medium.

23. A method for forming a superconducting yttrium-barium-copper-oxide ceramic material on an article comprising the steps of:
   (a) preparing a mixture of yttrium carbonate, barium carbonate, and copper carbonate;
   (b) preparing a colloidal dispersion of the mixture in a substantially non-conducting liquid medium;
   (c) providing two electrodes in the liquid medium, such that one of the electrodes comprises the article upon which deposition is desired;
   (d) applying a difference in electrical potential between the two electrodes such that the yttrium carbonate, barium carbonate and copper carbonate in the medium form a deposit on the electrode which comprises the article; and
   (e) heating the deposit in an oxygen containing atmosphere to form a superconducting oxide material.

24. The method of claim 23 in which step (e) comprises sintering the deposit at a temperature high enough to form an oxide material and densify the oxide material.

25. The method of claim 24 which further comprises the additional step (f) of heating the deposit in an oxygen atmosphere.

26. The method of claim 23, 24, or 25 which further comprises the additional step of shaping the article into a desired form after step (d).

27. The method of claim 23, 24, or 25 in which the liquid medium is an organic solvent.

28. The method of claim 23, 24, or 25 in which the liquid medium is selected form the group consisting of acetone, toluene, methyl-ethyl ketone, isobutyl alcohol, propylene carbonate, amyl acetate and butyl acetate.

29. The method of claim 23, 24, or 25 which further comprises adding a surfactant to the mixture.

30. The method of claim 23, 24, or 25 which further comprises adding a surfactant to the liquid medium.

31. The method of claim 23, 24, or 25 wherein the two electrodes are geometrically shaped and positioned so that the application of a difference in electrical potential between the two electrodes produces a gradient of electric field in the liquid medium.

32. A method for forming superconducting yttrium-barium-copper-oxide ceramic material on an article comprising the step of:
   (a) preparing a mixture of yttrium oxalate, barium oxalate, and copper oxalate;
   (b) preparing a colloidal dispersion of the mixture in a substantially non-conducting liquid medium;
   (c) providing two electrodes in the liquid medium, such that one of the electrodes comprises the article upon which deposition is desired;
   (d) applying a difference in electrical potential between the two electrodes such that the yttrium oxalate, barium oxalate and copper oxalate in the medium form a deposit on the electrode which comprises the article; and (e) heating the deposit in an oxygen containing atmosphere to form a superconducting oxide material.

33. The method of claim 32 in which step (e) comprises sintering the deposit at a temperature high enough to form an oxide material and densify the oxide material.

34. The method of claim 33 which further comprises the additional step (f) of heating the deposit in an oxygen atmosphere.

35. The method of claim 32, 33, or 34 which further comprises the additional step of shaping the article into a desired form after step (d).

36. The method of claim 32, 33, or 34 in which the liquid medium is an organic solvent.

37. The method of claim 32, 33, or 34 in which the medium is selected from the group consisting of acetone, toluene, methyl-ethyl ketone, isobutyl alcohol, propylene carbonate, amyl acetate and butyl acetate.

38. The method of claim 32, 33, or 34 which further comprises adding a surfactant to the mixture.

39. The method of claim 32, 33, or 34 which further comprises adding a surfactant to the liquid medium.

40. The method of claim 32, 33, or 34 wherein the two electrodes are geometrically shaped and positioned so that the application of a difference in electrical potential between the two electrodes produces a gradient of electric field in the liquid medium.

* * * * *